United States Patent [19]
Taguchi et al.

[11] Patent Number: 5,929,637
[45] Date of Patent: Jul. 27, 1999

[54] FLOW VELOCITY CALCULATING METHOD IN MAGNETIC RESONANCE IMAGING APPARATUS

[75] Inventors: Junichi Taguchi, Sagamihara; Shigeru Watanabe, Ibaraki-ken; Koichi Sano, Yokohama, all of Japan

[73] Assignee: Hitachi Medical Corporation, Tokyo, Japan

[21] Appl. No.: 08/798,343

[22] Filed: Feb. 10, 1997

[30] Foreign Application Priority Data

Feb. 19, 1996 [JP] Japan ..................................... 8-055481

[51] Int. Cl.$^6$ ....................................................... G01V 3/00
[52] U.S. Cl. ........................................... 324/306; 324/307
[58] Field of Search .................................. 324/306, 307, 324/309, 312, 300

[56] References Cited

U.S. PATENT DOCUMENTS

| | | | |
|---|---|---|---|
| 5,352,980 | 10/1994 | Machida .................................. | 324/306 |
| 5,408,180 | 4/1995 | Mistretta et al. ........................ | 324/306 |
| 5,773,975 | 6/1998 | De Becker et al. ..................... | 324/306 |

OTHER PUBLICATIONS

"Three–Dimensional Phase Contrast Agiography", Magnetic Resonance in Medicine, vol. 9, pp. 139–149 (1989).

"Dual Velocity Sensitive Tetrahedral Flow Encoding MR Angiography", SMRM (1992), p. 2810.

"Quantitative Flow Measurement in Phase Contrast MR Angiography", Journal of Computer Assisted Tomography, vol. 12(2), pp. 304–313.

"Image Reconstruction from Half of the Data Using a Phase Map", Sixth SMRM(1987), p. 809.

*Primary Examiner*—Louis Arana
*Attorney, Agent, or Firm*—Antonelli, Terry, Stout & Kraus, LLP

[57] ABSTRACT

The present invention intends to easily perform arithmetic operations for determining flow velocities without making phase correction and to reduce the aliasing error. To this end, a plurality of data pieces having phase sensitivity are measured using phase contrast pulse sequences in a magnetic resonance diagnostic apparatus. When four data pieces having phase sensitivity of tetrahedral type are acquired, four measured images are obtained. Individual measured images have vector values at corresponding points. Predetermined pair images are subjected to an arithmetic operation for determining an angle between two vectors at individual points on the images, the thus obtained phase images are added and a sum image is multiplied by a suitable coefficient to produce an x-direction flow velocity image. Flow velocity images in y and z directions are similarly obtained and images determining the magnitudes of flow velocities can also be produced.

4 Claims, 5 Drawing Sheets

FIG. 4A  POSITIVE FLOW ENCODE PULSE 401
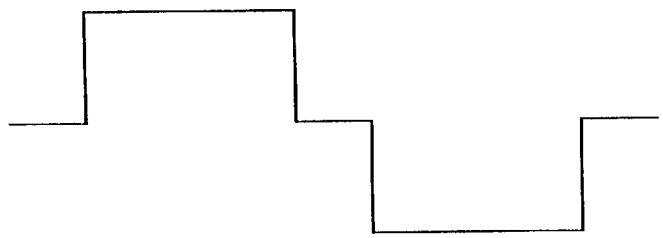
FIG. 4B  NEGATIVE FLOW ENCODE PULSE 402
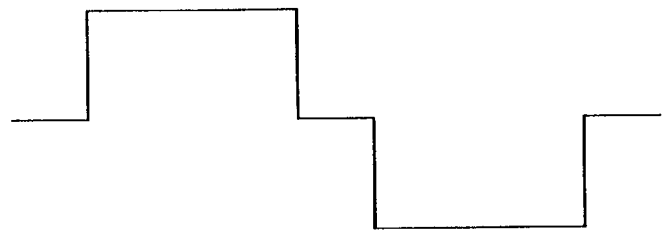
FIG. 4C  WITHOUT FLOW ENCODE PULSE 403

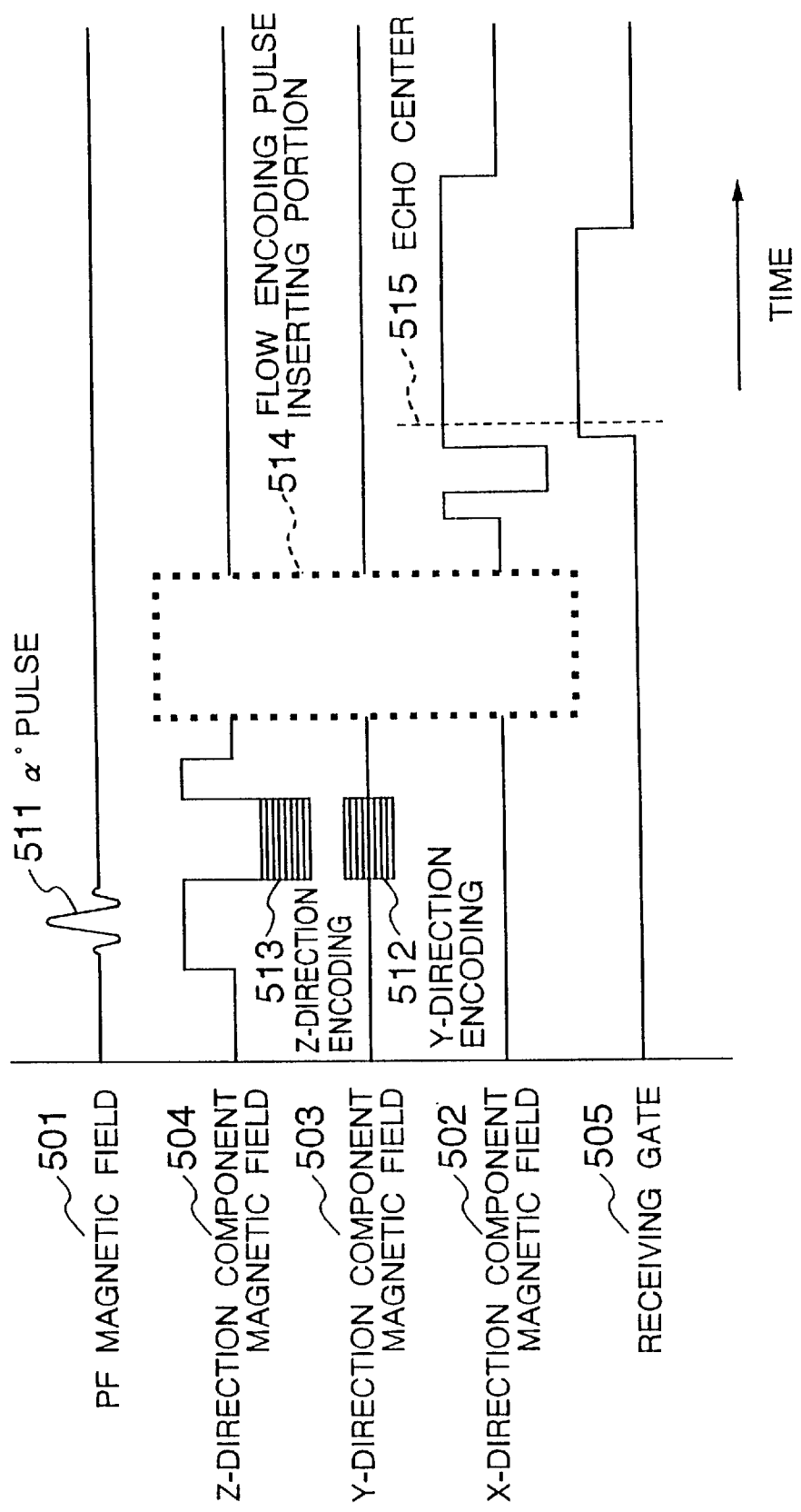

FLOW VELOCITY CALCULATING METHOD IN MAGNETIC RESONANCE IMAGING APPARATUS

BACKGROUND OF THE INVENTION

The present invention relates to a magnetic resonance (MR) imaging apparatus for imaging the interior of an object to be inspected by utilizing a MR phenomenon and more particularly, to a technique of obtaining blood flow velocity images.

The following literatures (1) to (3) disclose prior arts for obtaining blood flow images:

1) G. L. Dumoulin, S. P. Souza, M. F. Walker, and W. Wagle, "Three-Dimensional Phase Contrast Angiography", Magnetic Resonance in Medicine, Vol. 9, pp. 139–149 (1989). (hereinafter referred to as prior art (1))
2) Y. Machida, N. Ichinose, H. Sugimoto, T. Goro, and J. Hatta, "Dual Velocity Sensitive Tetrahedral Flow Encoding MR Angiography", Proceedings of Society of Magnetic Resonance in Medicine, Eleventh Annual Scientific Meeting, p. 2810 (1992). (hereinafter referred to as prior art (2))
3) M. F. Walker, S. P. Souza, and C. L. Dumoulin, "Quantitative Flow Measurement in Phase Contrast MR Angigraphy", Journal of Computer Assisted Tomography Vol. 12, no. 2, pp. 304–313 (1988). (hereinafter referred to as prior art (3))

The prior art (1) describes 6-component chase contrast pulse sequences in which a set of flow encode pulses of different polarities are used in three-axis directions and signals corresponding to three-dimensional flow velocities in the three directions are acquired through a total of 6 kinds of measurement operations or cycles.

On the basis of the thus obtained 6 kinds of measured signals, a difference between paired measured signals is calculated to produce three kinds of signals including flow velocity information pieces in the three directions (x, y, z). The thus produced signals are reconstructed by a two-dimensional Fourier transform method to form three kinds of three-dimensional image data pieces reflecting flow velocities in the respective directions. On the basis of the thus formed three kinds of three-dimensional image data pieces, three-dimensional angiographic data which is blood vessel (blood flow) imaging data which reflects the magnitude of flow velocities.

The three-dimensional angiographic data is used for observation of images of individual slices or is subjected to the projection processing and used for formation of projecting images. There are various kinds of projecting methods and integrated projection and maximum pixel projection are described. Maximum intensity projection (MIP) is described as being available as the maximum pixel projection.

In FIG. 2 of prior art (1), only three kinds of signal data pieces having flow velocity sensitivity are described but practically, signal data having flow velocity sensitivity in one direction is produced as a difference signal between signal data obtained by applying a "+" flow encode pulse in the one direction and signal data obtained by applying a "−" flow encode pulse in the one direction.

Accordingly, from the standpoint of the manner of applying the flow encode pulse in prior art (1), two signal measurement cycles are carried out to obtain flow velocity sensitive signal data on one axis and six signal measurement cycles in total are effected on three axes and therefore, this method is called 6-component phase contrast pulse sequences.

The methods for performing imaging with phase sensitivity of 6 components and 4 components are generally called phase contrast pulse sequences.

Prior art (2) describes a measuring method of tetrahedral measuring type which is a kind of 4-component phase contrast pulse sequences in which measurement is carried out using four kinds of flow encode pulse patterns, measured data pieces are reconstructed and thereafter values approximately proportional to flow velocities are calculated.

Prior art (2) shows that even with the 4-component phase contract pulse sequences of tetrahedral type, three-dimensional angiographic data reflecting the magnitude of flow velocities can be obtained. This prior art method is similar to the 6-component sequences of prior art (1).

Prior art (3) describes a method in which a plurality of measured data pieces with different flow encode pulse patterns are reconstructed and flow velocities are determined by using phase information of the reconstructed images. Since the flow velocities are determined by evaluating the phases of the measured data pieces, accurate determination of flow velocities can be ensured in the case of a flow which is at a constant velocity and has no flow velocity distribution in a cross section.

Even in the presence of a flow velocity distribution in a cross section, a detailed analysis has been made to introduce a correction formula for determining an average flow velocity. For non-steady flow which is not at a constant velocity, an analysis has also been made.

In prior art (1), a complex difference between data obtained when the flow encode is positive and data obtained when the flow encode is negative is calculated to form three-dimensional angiographic data and data value depends on not only the flow velocity but also the excited state of magnetization, indicating that the data is not obtained by quantitatively determining flow velocities. In prior art (2), angiographic data depending on flow velocities can be obtained as in the case of prior art (1) but the flow velocities cannot be determined quantitatively.

In prior art (3), the flow velocity is determined by evaluating the phase. But the phase is evaluated in connection with each measured data pieces and consequently, the aliasing error is increased. The aliasing error raises the following problem when the phase exceeds the phase evaluation range of from $-\pi$ radians to $\pi$ radians. More particularly, since a measured value takes a value which is caused to fall in the range of from $-\pi$ radians to $\pi$ radians by being added with or subtracted by integer times the $2\pi$ radians, a large measurement error takes place.

Especially, when offset of the phase is added because of non-uniformity of the static magnetic field, aliasing is caused by a slight change in phase due to flow velocity. Accordingly, the processing of removing offset due to the non-uniformity of static field is required.

When measurement of prior art (2) is carried out, calculation is effected as shown in FIG. 3 by the method of prior art (3) for independently evaluating the phases of individual measured data pieces.

FIG. 3 shows calculation effected by the method of prior art (3) for independently evaluating the phases of individual measured data pieces when measurement of prior art (2) is carried out.

In the method of independently evaluating The phases of the individual measure data pieces, there needs the processing of eliminating offset due to non-uniformity of static magnetic field and therefore, a phase presumptive image 310 for the static magnetic field non-uniformity is prepared by means of an image filter 300 for low-pass filtering so as to correct the static magnetic field non-uniformity.

Measured images formed by reconstructing the individual measured signals are four kinds of images 101 to 104, and causes for assignment of phases are indicated in parenthesis in order of static magnetic field non-uniformity, x-direction flow velocity sensitivity measurement, y-direction flow velocity sensitivity measurement and z-direction flow velocity sensitivity measurement.

For example, (+, −, +, +) shows that phase assignment due to static magnetic field inhomogeneity is +θh, phase assignment due to x-direction flow velocity is −θx, phase assignment due to y-direction flow velocity is +θy and phase assignment due to z-direction flow velocity is +θz.

The phase assignment due to static magnetic field inhomogeneity θh has different values for different sites and has the same value for individual measurement cycles. The phase assignment θx has a value proportional to x-direction flow velocity and its sign is determined by the manner of applying the flow encode pulses in the individual measurement cycles. Signs of θy and θz are similarly determined by the manner of applying the flow encode pulses in the individual measurement cycles.

The respective measured images 101 to 104 are vector images each of which has vectors having the magnitudes and directions at respective points on an image. The phase is an angle a vector makes to a predetermined axis direction so as to represent a direction of the vector.

One measured image 101 is subjected to the processing of low-pass filtering by means of the image filter 300 to form a phase presumptive image 310 for static magnetic field inhomogeneity. Roughly speaking, the phase presumptive image is a vector image roughly capturing static magnetic field distortion.

Next, an arithmetic operation for subtraction of phase by a phase of the phase presumptive image 310 is applied to each of the images to form corrected images 301 to 304 subject to phase correction. The corrected images 301 to 304 are vector images which are almost removed of the phase assignment due to static magnetic field and an uncorrected remaining phase assignment is indicated by d in the Figure.

Next, the phases of the individual corrected images 301 to 304 are evaluated to form phase images 311 to 314. When a flow velocity image in The x direction is desired to be prepared, the phase images 311 and 312 are added along with addition of the phase images 313 and 314 and a difference between both the sums is calculated and multiplied by a predetermined coefficient to determine a flow velocity in the x direction. Similarly, flow velocity images in the y and z directions can be obtained and images indicative of the magnitudes of flow velocities can be obtained.

However, in the above method of FIG. 3, there arise problems that much time is consumed for arithmetic operation of phase correction using the image filter 300 for low-pass filtering and in addition, even the phase images subject to the phase correction have phases which depend on three flow velocities in the x, y and z directions and eventually the aliasing error is increased by evaluating the phase directly from one image.

SUMMARY OF THE INVENTION

An object of the present invention is to simply perform arithmetic operations for determining flow velocities without making phase correction.

Another object of the present invention is to reduce the aliasing error.

To accomplish the above objects, the present invention is constructed as follows.

In a MR diagnostic apparatus having unit for generating a static magnetic field, a gradient magnetic field and a radio frequency magnetic field, detection unit for measuring MR signals from an object to be inspected, processing unit for applying various arithmetic operations to detected signals and control unit for controlling execution of each of the above means, a plurality of signal data pieces are acquired using phase contrast pulse sequences for performing imaging by changing the combination of flow encode pulses, the plurality of signal data pieces are reconstructed to produce vector images having magnitudes and phases, predetermined images to be paired are selected from the vector images, angle images are determined by performing, at individual points, an arithmetic operation for determining an angle between vectors at corresponding points of two images, a plurality of angle images are determined by performing calculating operations for determining the angle images in connection with predetermined kinds of image pairs, and an arithmetic operation for obtaining numerical values corresponding to flow velocities from the angle images is performed.

As the phase contract pulse sequences, 4-component phase contrast pulse sequences for performing measurement by using a combination of four kinds of flow encode pulses is used.

As the 4-component phase contrast pulse sequences, a measuring method of tetrahedral measuring type is used.

Further, given that the correspondence coefficient between flow velocity and phase which depends on the magnitude of flow encode is a, an angle image determining an angle between two vectors of vector images A and B at individual points is φ (A, B), a vector image obtained by reconstructing a signal obtained through measurement with a combination of flow encode pulses of (−, −, −) is G1, and vector images similarly obtained by reconstructing signals obtained through measurement operations with combinations of flow encode pulses of (−, +, +), (+, −, +) and (+, +, −) are G2, G3 and G4, where signs in parenthesis indicate an x-axis flow encode pattern, a y-axis flow encode pattern and a z-axis flow encode pattern, with "+" meaning positive flow encode and "−" meaning negative flow encode, flow velocity images are calculated as follows:

x-direction flow velocity image $$Vx=a^*(\phi(G_1, G_3)+\phi(G_2, G_4))/4$$

y-direction flow velocity image $$Vy=a^*(\phi(G_1, G_2)+\phi(G_3, G_4))/4$$

z-d-rection flow velocity image $$Vz=a^*(\phi(G_1, G_3)-\phi(G_2, G_4))/4$$

absolute value image of flow velocity $$V=\sqrt{(Vx^*Vx+Vy^*Vy+Vz^*Vz)}$$

Further, flow velocity images may be calculated as follows:

x-direction flow velocity image $$Vx=a^*(\phi(G_1, G_3)+\phi(G_2, G_4))+\phi(G_1, G_4)+\phi(G_2, G_3))/8$$

y-direction flow velocity image $$Vy=a^*(\phi(G_1, G_2)+\phi(G_3, G_4))+\phi(G_1, G_4)-\phi(G_2, G_3))/8$$

z-direction flow velocity image $$Vz = a*(\phi(G_1, G_3) - \phi(G_2, G_4)) + \phi(G_1, G_2) - \phi(G_3, G_4))/8$$

absolute value image of flow velocity $$V = \sqrt{(Vx*Vx + Vy*Vy + Vz*Vz)}$$

Also, in a MR diagnostic apparatus having unit for generating a static magnetic field, a gradient magnetic field and a radio frequency magnetic field, detection unit for measuring MR signals from an object to be inspected, processing unit for applying various arithmetic operations to detected signals and control unit for controlling execution of each of the above units, four kinds of signal data pieces are acquired using 4-component phase contrast pulse sequences of tetrahedral measuring type as phase contrast pulse sequences for performing imaging by changing the combination of flow encode pulses, the four kinds of signal data pieces are reconstructed to produce vector images having magnitudes and phases, predetermined images are selected from the vector images, vectors at corresponding points of two images are added to form a plurality of sum images, predetermined sum images to be paired are selected from the sum images, angle images are determined by performing, at individual points, an arithmetic operation for determining an angle between vectors at corresponding points of two sum images, and an arithmetic operation for obtaining numerical values corresponding to flow velocities from the angle images is performed.

Further, flow velocities are calculated as follows:

x-direction flow velocity image $$Vx = a*\phi(G_1+G_2, G_3+G_4)/2$$

y-direction flow velocity image $$Vy = a*\phi(G_1+G_3, G_2+G_4)/2$$

z-direction flow velocity image $$Vz = a*\phi(G_1+G_4, G_2+G_3)/2$$

absolute value image of flow velocity $$V = \sqrt{(Vx*Vx + Vy*Vy + Vz*Vz)}$$

BRIEF DESCRIPTION OF THE DRAWINGS

FIGS. 4A, 4B and 4C are diagrams showing flow encode pulse patterns.

FIG. 5 is a general pulse sequence diagram based on phase contrast pulse sequences.

DESCRIPTION OF THE PREFERRED EMBODIMENTS

Figure 1:
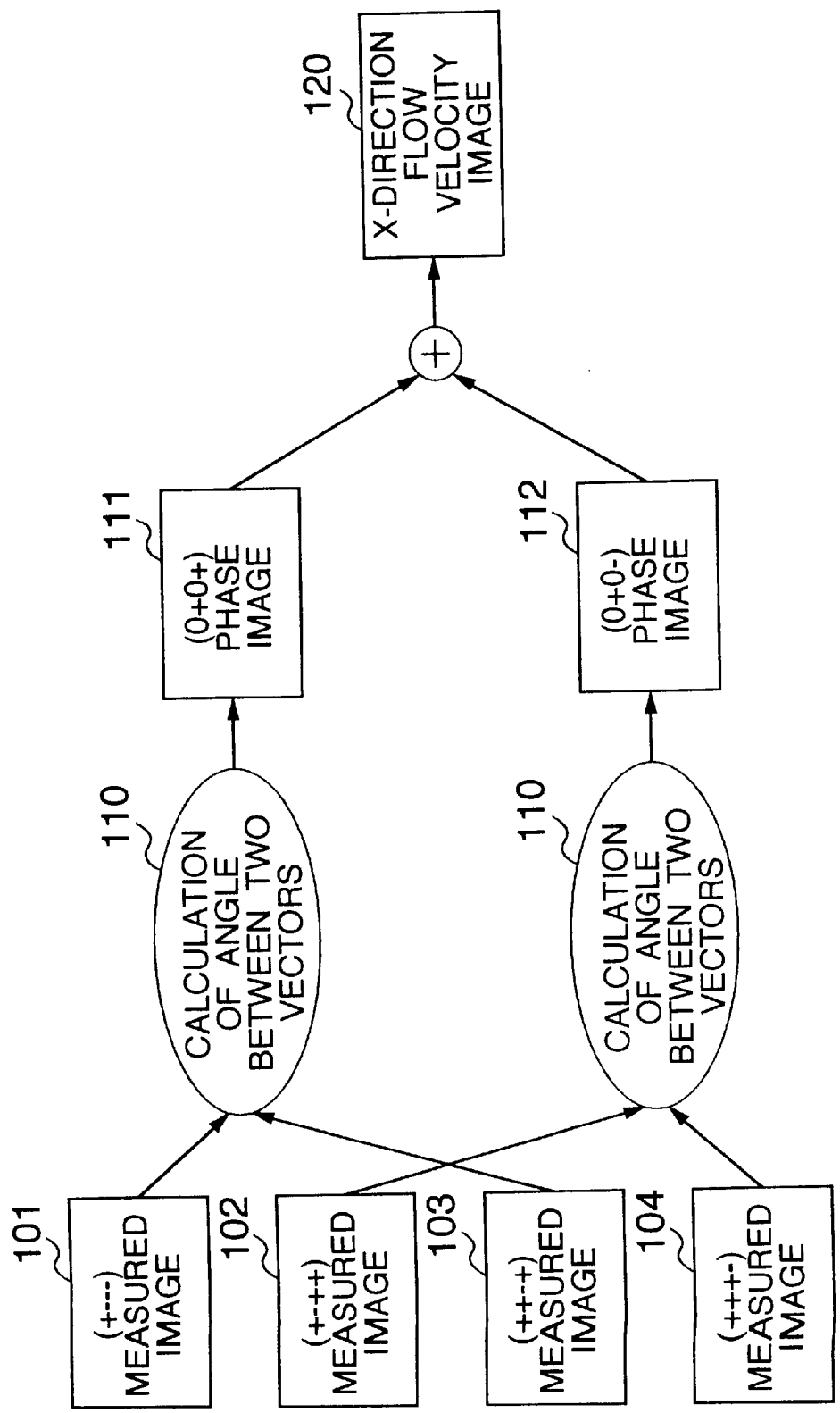
FIG. 1 is a flow diagram showing the flow of arithmetic operation when flow velocities in x-axis direction are calculated in a flow velocity calculatlng method of the present invention.

Preferred embodiments of the present invention will now be described in order of sections (1) to (4).

In section (1), the construction of a magnetic resonance (MR) diagnostic apparatus in which the present invention is carried out will be described.

In section (2), the overall procedure of the present invention will be outlined.

In section (3), flow velocity contract pulse sequences which are for an imaging method used in the present invention will be described.

In section (4), a concrete calculation method to be adopted when the imaging method is specifically determined will be described.

(1) Construction

Figure 2:
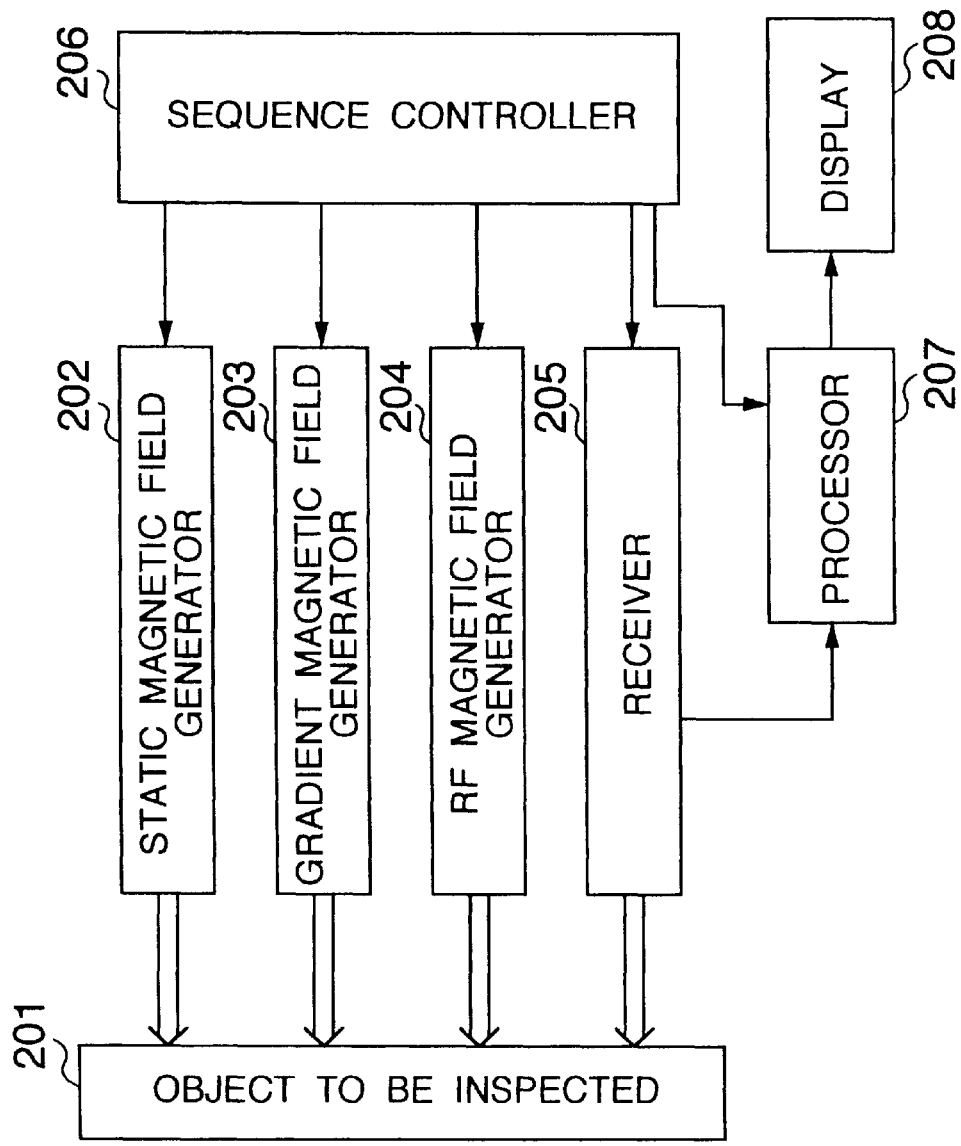
FIG. 2 is a block diagram showing the construction of a MR diagnostic apparatus of the present invention.
Figure 3:
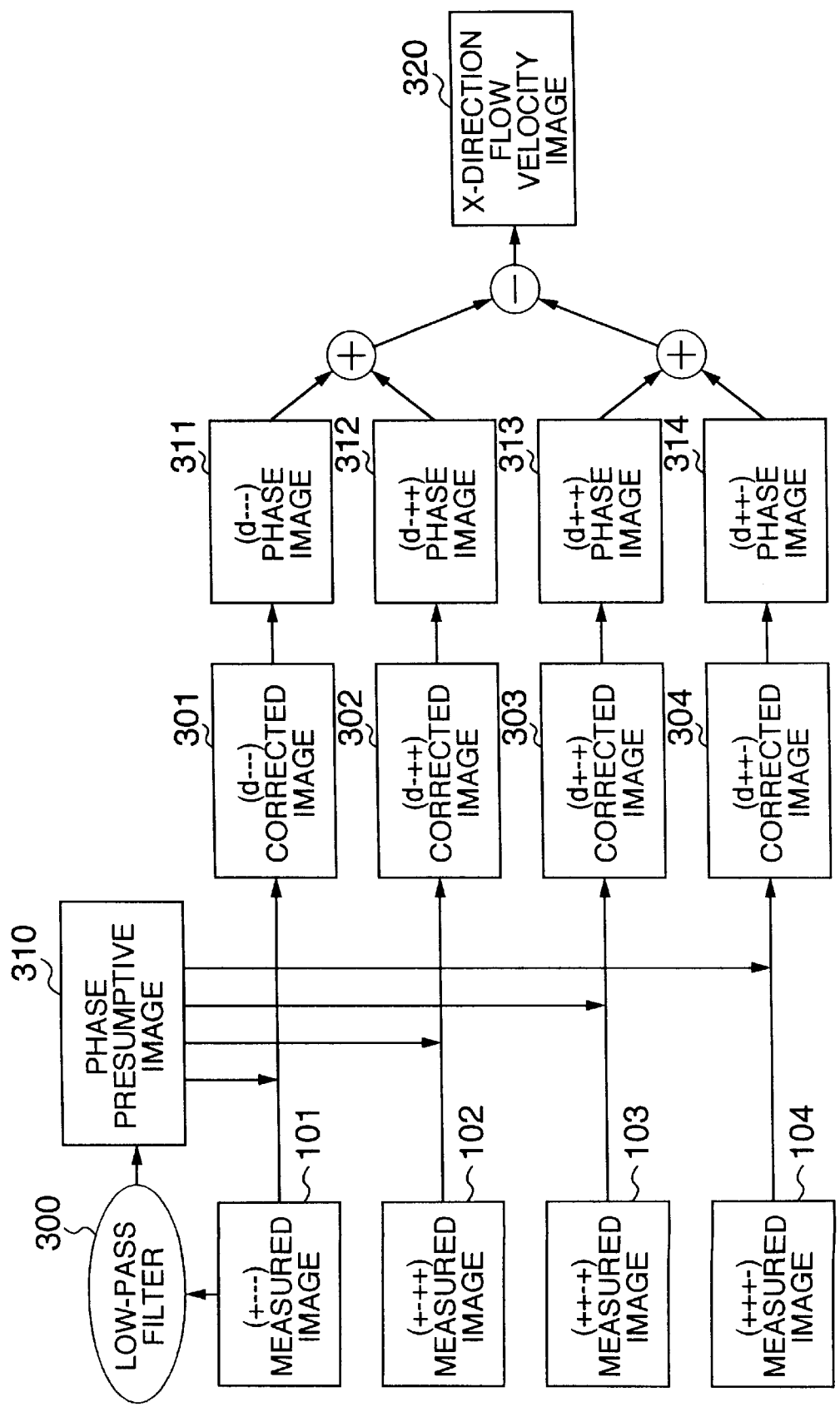
FIG. 3 is a block diagram showing a calculating method when a conventional method is used in which phases are evaluated every measured image.

Referring to FIG. 2, there is illustrated in schematic block diagram form a MR diagnostic apparatus in which the present invention is carried out. The MR diagnostic apparatus shown in FIG. 2 will be described briefly hereunder.

The MR diagnostic apparatus of FIG. 2 comprises a static magnetic field generator 202, a gradient magnetic field generator 203, a radio frequency (RF) magnetic field generator 204, a receiver 205, a sequence controller 206, a processor 207 and a display 208.

The static magnetic field generator 202 generates a uniform magnetic field of high intensity which in turn causes magnetizations in an object 201 to be inspected. The gradient magnetic field generator 203 has units of generating gradient magnetic fields in three directions of x, y and z. The units can be operated independently of each other so that a gradient magnetic field of desired intensity may be generated in a desired direction at a desired time point by setting application timings and application intensities of the respective gradient magnetic fields in the x, y and z directions. With a gradient magnetic field applied, the intensity of magnetic field is changed in accordance with the position in the direction of the gradient magnetic field and the Larmor frequency of magnetization in the object 201 to be inspected is changed with a change in magnetic field intensity to make it possible to discriminate a detection position from other positions in the object 201 to be inspected.

The RF magnetic field generator 204 is adapted to generate a desired RF magnetic field which is used, as necessary, for resonance excitation of magnetizations in the object 201 to be inspected, so that only magnetizations satisfying the resonance condition are rendered to generate electromagnetic waves. The combination of the gradient magnetic field and the RF magnetic field permits electromagnetic waves to be generated from only a slice region which satisfies the resonance condition and hence imaging of the slice region can be ensured.

The receiver 205 measures electromagnetic waves generated when magnetizations in the object 201 to be inspected are resonantly excited and sends signal data to the processor 207. In the receiver 205, an electromagnetic wave is received by means of a coil, the received signal is amplified and then subjected to quadrature modulation for separation into a signal which is in phase with a reference signal and a signal which is 90° out of phase from the reference signal, and the thus separated signals are measured. Of the measured signal data, the signal in phase with The reference signal is made to correspond to real numbers and the signal which is 90° out of phase from the reference signal is made to correspond to imaginary numbers in order that the measured signal data can be represented by complex numbers.

The processor 207 saves the measured signal data in terms of complex numbers and performs various kinds of arithmetic operations including reconstruction. The reconstruction is carried out by subjecting the measured signal data in terms of complex numbers to complex Fourier transform. Image data produced through the complex Fourier transform is data of complex numbers. A complex number can be expressed as a vector on a complex plane defined by real axis and imaginary axis. Accordingly, the image data produced through the complex Fourier transform can be handled as vectors. The image data subject to the complex Fourier transform is herein called vector images. When a complex number is considered as a vector on the complex plane, the complex number has a magnitude and a direction on the complex plane. The absolute value of a vector image corresponds to the magnitude of a vector and the phase of the vector image corresponds to an angle the vector makes to the real axis. Since the vector image cannot be displayed by itself, either an absolute value image obtained by eliminating the magnitude of the vector from the vector image or a phase image obtained by eliminating the phase of the vector from the vector image is prepared and displayed on the display 208. Alternatively, a flow velocity image may be prepared through calculation to be described later and may be displayed on the display 208.

The sequence controller 206 controls the operation of each of the gradient magnetic field generator 203, RF frequency generator 204, receiver 205, processor 207 and display 208. The sequence controller 206 has the function of ordinary computers, having a program for sending commands to operate the individual units and data describing the operational states of the individual units and being consulted by the program.

The processor 207 is constructed of hardware dedicated to high-speed or fast arithmetic operations and it carries out arithmetic operations for data processing by executing a program described by a program language specific to the dedicated hardware. Gathering from the function of the processor 207, an ordinary computer may be used as the processor 207.

(2) Procedure Outline

Firstly, in the MR diagnostic apparatus constructed as above, imaging is carried out pursuant to phase contrast pulse sequences to obtain a plurality of signal data pieces.

Imaging operation is started by sending a program of imaging sequence based on the phase contrast pulse sequences and a data value to the sequence controller 206. Obtained signal data pieces are sent to the processor 207 and reconstructed therein. The signal data pieces are subjected to an arithmetic operation for obtaining flow velocities which is based on an arithmetic operation for evaluating an angle difference between images to be paired (each having a vector value) in order to obtain a flow velocity image and a flow velocity value which in turn are displayed on the display 208. The phase contrast pulse sequences and flow velocity calculation will be described specifically hereinafter.

(3) Phase Contrast Pulse Sequences

FIGS. 4A, 4B and 4C show application patterns of the gradient magnetic fields called flow encode pulses which make a portion of a flow have a phase.

With a positive flow encode pulse as shown at 401 in FIG. 4A applied, an obtained image is rendered to have a positive phase which is proportional to a flow velocity value in a direction of a gradient magnetic field applied with the positive flow encode pulse.

With a negative flow encode pulse as shown at 402 in FIG. 4B applied, an obtained image is rendered to have a negative phase which is similarly proportional to a flow velocity value in a direction of a gradient magnetic field applied with the negative flow encode pulse.

Without flow encode pulse as shown at 403 in FIG. 4C, the phase of an obtained image does not change with velocities.

Referring now to FIG. 5, there is illustrated a general pulse sequence diagram of phase contrast pulse sequences wherein abscissa represents time and ordinate represents operational states of the individual units.

A RF magnetic field 501 is generated by the RF magnetic field generator 202 and an x-direction gradient magnetic field 502, a y-direction gradient magnetic field 503 and a z-direction magnetic field 504 are generated by the gradient magnetic field generator 203. A static magnetic field is of course generated but its illustration is omitted.

A receiving gate 505 is sent from the sequence controller 206 to the receiver 205, whereby signal reception is effected during the gate-on state (upward raised portion in the drawing).

An $a\alpha°$ pulse 511 excites magnetizations in an imaging slice by $\alpha°$, where $\alpha$ may be selected to a desired value but in the case of three-dimensional imaging, it may often be selected to a value in the range between 20° and 30°. Z-direction and y-direction encodings 513 and 512 are gradient magnetic fields each having a combination of intensities which changes slightly every cycle of operation.

During a time interval corresponding to a flow encode pulse inserting portion 514, any one of the three pulse patterns shown in FIGS. 4A, 4B and 4C is selected and applied independently in connection with each of the x, y and z three axes. Concretely, the pulse pattern selection is effected in various ways and two kinds of ways to select a pulse pattern will be described later in sections (4-1) and (4-2).

An echo center 515 is an instant at which the center of an echo signal takes place and in the case of FIG. 5, the echo center 515 is located at the left edge of on-time of the receiving gate 505. Thus, measurement exemplified herein is asymmetric in that the echo center 515 is not located at the center of the receiving gate 505 and is called asymmetric measurement.

In the case of symmetric measurement, reconstruction can be accomplished through Fourier transform process but in the case of asymmetric measurement, reconstruction is carried out by either a Fourier transform method in which "0" is filled in unmeasured portions of data or a half Fourier method.

For measurement with flow velocity sensitivity, the Fourier transform method in which 0 is filled is typically used.

For the half Fourier method, one may refer to the following literature (prior art (4)):

K. Sano, K. Suzuki, T. Yokoyama, and H. Koizumi, "Image Reconstruction from Half of the Data Using a Phase Map", Proceedings of Society of Magnetic Resonance in Medicine, Sixth Annual Scientific Meeting, p. 809 (1987).

In the phase contrast pulse sequences as above, the type of measurement is determined concretely depending on which flow encode pattern is inserted in the flow encode inserting portion 514, and concrete calculation methods for determining flow velocities are available which differ with measurement types. This will be described in the following section.

(4) Concrete Measurement Type of Phase Contrast Pulse Sequences and Flow Velocity Calculating Method Two concrete measurement types of phase contrast pulse sequences and flow velocity calculating methods therein will be described in subsections (4-1) and (4-2) and an arithmetic operation method of determining an angle between two vectors will be described in subsection (4-3).

(4-1) 6-Component Phase Contrast Pulse Sequences

An arithmetic operation method of determining flow velocities when measurement is effected using 6-component phase contrast pulse sequences disclosed in the previously-described literature of prior art (1) as the phase contrast pulse sequences will be described specifically.

In the illustration of the literature of prior art (1), the data is depicted as being of only three pieces but the data shown in the illustration of the literature is difference data between paired two data pieces and in effect, 6 basic signal data pieces are obtained.

In the following description, the pulse pattern to be inserted in the flow encode inserting portion 514 of FIG. 5 is indicated by "+" when the positive flow encode pulse at 401 is used, by "−" when the negative flow encode pulse at 402 is used and by "0", when no flow encode pulse is used as shown at 403, and flow encode patterns to be inserted on the individual axes (x, y, z) are expressed using the above symbols.

In the 6-component phase contrast pulse sequences, (+, 0, 0) is performed in the first cycle of measurement, (−, 0, 0) is performed in the second cycle of measurement, (0, +, 0) is performed in the third cycle of measurement, (0, −, 0) is performed in the fourth cycle of measurement, (0, 0, +) is performed in the fifth cycle of measurement and (0, 0, − is performed in the sixth cycle of measurement. It is now assumed that complex three-dimensional signal data pieces obtained through the respective measurement cycles are indicated by $S_1$ to $S_6$ and three-dimensional image data pieces obtained by subjecting the signal data pieces to complex Fourier transform are indicated by $G_1$ to $G_6$. A complex number can be expressed by a vector on a complex plane defined by real axis and imaginary axis. The three-dimensional image data pieces $G_1$ to $G_6$ produced through the complex Fourier transform are data pieces of complex numbers and therefore they can be handled as vector images, if the real parts treats the one of axes and the imaginary parts treats the other of axes.

By symbolizing Fourier transform as F (·) and indicating an arithmetic operation for determining an angle between two vectors at individual points on two vector images as $\phi(\cdot,\cdot)$, from which an angle image (angle difference image) can be obtained, flow velocity images Vx, Vy and Vz on the respective axes can be determined in accordance a method to be described below.

$$Gi=F(Si) \text{(where } 1\leq i\leq 6) \tag{1}$$

$$Vx=\alpha\cdot\phi(G_1, G_2)/2 \tag{2}$$

where is the coefficient representing the relation between flow velocity and phase and being determined by the flow encode, and when the time duration of each of the two peaks of the flow encoding is T(sec), the heights of the respective peaks are G and −G (Gauss/cm) and the time interval between intermediate points of the two peaks is U(sec), the following holds:

$$\alpha=1/(\gamma\cdot G\cdot T\cdot U) \tag{3}$$

where $\gamma$ is the magnetic rotation ratio which is 4258 revolutions/(gauss·sec) for hydrogen atom. With the phase indicated in terms of radian, it amounts to $2\pi\cdot 4258$ radians/(gauss·sec).

Similarly, $$Vy=\alpha\cdot\phi(G_3, G_4)/2 \tag{4}$$

$$Vz=\alpha\cdot\phi(G_5, G_6)/2 \tag{5}$$

hold.

An arithmetic equation for determining an absolute value image V of flow velocity from the respective flow velocity images Vx, Vy and Vz is as follows:

$$V=\sqrt{(Vx*Vx+Vy*Vy+Vz*Vz)} \tag{6}$$

It is to be noted that arithmetic operations of equations 2, 4, 5 and 6 are carried out for data pieces at individual points on the image.

(4-2) 4-Component Phase Contrast Pulse Sequences

In the case of data measurement pursuant to the method shown in the literature of prior art (2), a data measuring method and a flow velocity calculating method to be described below are employed.

The method of obtaining four kinds of data by performing four cycles of measurement is called 4-component phase contrast pulse sequences and especially, the 4-component phase contrast pulse sequences described in the literature (2) is called a measuring method of tetrahedral measuring type.

In the tetrahedral measuring type, application patterns of x, y and z flow encode pulses are set to (−, −, −), (−, +, +), (+, −, +) and (+, +, −) and four cycles of measurement are carried out.

When signs of phase assignment for static magnetic field inhomogeneity are additionally labeled, there result (+,−,−, −), (+, −, +, +) ,(++, −, +) and (+, +, +, −).

Referring to FIG. 1, there is illustrated a flow diagram showing the flow of arithmetic operation for calculation of flow velocities in the x-axis direction.

For measured images 101 to 104 (represented by $G_1$ to $G_4$) obtained as a result of four cycles of measurement, angle calculating operations 110 are carried out in which an angle between two vectors at corresponding points of paired images is determined, thereby producing phase images 111 and 112. By adding these phase images, a value proportional to a flow velocity in the x direction can be obtained and the thus obtained flow velocity is multiplied by a predetermined coefficient to provide a flow velocity image 120. In the Figure, signs in parenthesis indicate states of phase rotation in order of phase rotation due to the influence of the static magnetic field, phase rotation due to x-direction flow velocity, phase rotation due to y-direction flow velocity and phase rotation due to z-direction flow velocity, with "0" showing that data without phase rotation is obtained at the corresponding portion.

The above operations are expressed using equations as below.

For obtained three-dimensional measured signals $S_1$ to $S_4$, an angle image (angle difference image) is produced through an arithmetic operation $\phi(\cdot, \cdot)$ for determining an angle between two vectors, where $\alpha$ is the coefficient having the same value as that in the case of the above subsection (4-1). Thus, $$Vx=\alpha\cdot(\phi(G_1, G_3)+\phi(G_2, G_4))/4 \tag{7}$$

Similarly, Vy and Vz are determined through the following arithmetic operations:

$$Vy=\alpha\cdot(\phi(G_1, G_2)+\phi(G_3, G_4))/4 \tag{8}$$

$$Vz=\alpha\cdot(\phi(G_1, G_3)-\phi(G_2, G_4))/4 \tag{9}$$

Alternatively, Vx, Vy and Vz may be determined as Vx', Vy' and Vz' pursuant to a different method from that pursuant to equations 7 to 9 as above, the different method being expressed by the following equations 10 to 12:

$$Vx'=\alpha\cdot(\phi(G_1, G_4)+\phi(G_2, G_3))/10 \tag{10}$$

$$Vy'=\alpha\cdot(\phi(G_1, G_4)-\phi(G_2, G_3))/4 \tag{11}$$

$$Vz' = \alpha \cdot (\phi(G_1, G_2) - \phi(G_3, G_4))/4 \quad (12)$$

In addition to the above, Vx and Vx', Vy and Vy' and Vz and Vz' may be averaged, respectively, to provide average flow velocities Vx", Vy" and Vz" as follows:

$$Vx'' = \alpha \cdot (\phi(G_1, G_3) + \phi(G_2, G_4) + \phi(G_1, G_4) + \phi(G_2, G_3))/8 \quad (13)$$

$$Vy'' = \alpha \cdot (\phi(G_1, G_2) + \phi(G_3, G_4) + \phi(G_1, G_4) - \phi(G_2, G_3))/8 \quad (14)$$

$$Vz'' = \alpha \cdot (\phi(G_1, G_3) - \phi(G_2, G_4) + \phi(G_1, G_2) - \phi(G_3, G_4))/8 \quad (15)$$

As seen from equation 6, a flow velocity image V may be determined from Vx', Vy' and Vz' or from Vx", Vy" and Vz".

Alternatively, an angle image can be determined by performing an arithmetic operation in which predetermined sum images are prepared and an angle between vectors at the corresponding points of the paired sum images is determined and then values corresponding to flow velocities can be calculated, thus expressing flow velocities Vx''', Vy''' and Vz''' in the respective directions by using similar symbols as follows:

$$vx''' = \alpha \cdot \phi(G_1 + G_2, G_3 + G_4)/2 \quad (16)$$

$$Vy''' = \alpha \cdot \phi(G_1 + G_3, G_2 + G_4)/2 \quad (17)$$

$$Vz''' = \alpha \cdot \phi(G_1 + G_4, G_2 + G_3)/2 \quad (18)$$

Similarly, a flow velocity image V can be determined from Vx''', Vy''' and Vz'''.

The coefficient α is indicative of the relation between flow velocity and phase and for example, in the case of equation 16, an arithmetic operation coefficient when the x-direction flow velocity image Vx''' is determined from the angle image $\phi(G_1+G_2, G_3+G_4)$ can be said to be α/2.

In this manner, flow velocity images in the respective axis directions and a flow velocity image representative of the magnitude of flow velocity can be obtained.

In the case where data to be handled is three-dimensional data, for the purpose of displaying such data, the data must once be projected on the two-dimensional plane. There are various projecting methods including a method in which a flow velocity on the projection view line is projected at a point where absolute values of flow velocities in the respective directions are maximized and another method in which angiographic data based on an arithmetic operation of complex differences for angiogram is prepared and a flow velocity on the projection view line is projected at a point where the angiographic data is maximized.

Further, a flow velocity value on a designated image can be displayed, the direction of a flow velocity at a designated site can be indicated by an arrow and a vector representative the magnitude and direction of a flow velocity can be displayed.

(4-3) Arithmetic Operation for Determining an Angle between Two Vectors

An example of the arithmetic operation $\phi(\cdot, \cdot)$ for determining an angle between two vectors will be described. The arithmetic operation for determining an angle between vectors a and b can be effected as follows:

$$\phi(a, b) = \text{atan2}(a \times b, a \cdot b) \quad (19)$$

where $a \times b$ represents an outer product of the vectors a and b and $a \cdot b$ represents an inner product of the vectors a and b.

Indicated by atan2(y, x) is an arithmetic operation for determining an angle a line segment extending from the origin to a point (x, y) makes to the x axis. In FORTRAN and C language, this arithmetic operation is prepared as a standard function.

According to the present invention, the arithmetic operation for determining flow velocities can be carried out easily without making phase correction and in addition, the aliasing error can advantageously be more reduced in the present invention than in the method which evaluates the phase every measured image.

We claim:

1. A flow velocity calculating method in a magnetic resonance diagnostic apparatus having means for generating a static magnetic field, a gradient magnetic field and a radio frequency magnetic field, detection means for measuring magnetic resonance signals from an object to be inspected, processing means for applying various arithmetic operations to detected signals and control means for controlling execution of each of said means, comprising the steps of:

acquiring a plurality of signal data pieces by using phase contrast pulse sequences for performing imaging by changing the combination of flow encode pulses;

producing vector images having magnitudes and phases by reconstructing the plurality of signal data pieces;

selecting predetermined images to be paired from the vector images and determining angle images by performing, at individual points, an arithmetic operation for determining an angle between vectors at corresponding points of two images; and performing an arithmetic operation for obtaining numerical values corresponding to flow velocities from the angle images.

2. A flow velocity calculating method according to claim 1, wherein as the phase contrast pulse sequences, 4-component phase contrast pulse sequences for performing measurement by using a combination of four kinds of flow encode pulses is used.

3. A flow velocity calculating method according to claim 2, wherein as the 4-component phase contrast sequences, a measuring method of tetrahedral measuring type is used.

4. A flow velocity calculating method in a magnetic resonance diagnostic apparatus having means for generating a static magnetic field, a gradient magnetic field and a radio frequency magnetic field, detection means for measuring magnetic resonance signals from an object to be inspected, processing means for applying various arithmetic operations to detected signals and control means for controlling execution of each of said above means, comprising the steps of:

acquiring four kinds of signal data pieces by using 4-component phase contrast pulse sequences of tetrahedral measuring type as phase contrast pulse sequences for performing imaging by changing the combination of flow encode pulses;

reconstructing the four kinds of signal data pieces to produce vector images having magnitudes and phases;

selecting predetermined images from the vector images and adding vectors at corresponding points of two images to form a plurality of sum images;

selecting predetermined sum images to be paired from the sum images and determining angle images by performing, at individual points, an arithmetic operation for determining an angle between vectors at corresponding points of two sum images; and performing an arithmetic operation for obtaining numerical values corresponding to flow velocities from the angle images.

* * * * *